United States Patent
Kubota

(10) Patent No.: US 7,491,975 B2
(45) Date of Patent: Feb. 17, 2009

(54) LIGHT-EMITTING DEVICE, METHOD FOR MAKING THE SAME, AND ELECTRONIC APPARATUS

(75) Inventor: Takehiko Kubota, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 83 days.

(21) Appl. No.: 11/683,112

(22) Filed: Mar. 7, 2007

(65) Prior Publication Data
US 2007/0273305 A1 Nov. 29, 2007

(30) Foreign Application Priority Data
Mar. 28, 2006 (JP) ............................. 2006-088306

(51) Int. Cl.
*H01L 29/18* (2006.01)
(52) U.S. Cl. .................... 257/88; 257/92; 257/103; 257/E33.002; 438/28; 438/34
(58) Field of Classification Search ........... 257/79–103, 257/E27.002; 438/28, 34–40
See application file for complete search history.

(56) References Cited

U.S. PATENT DOCUMENTS
2003/0146371 A1* 8/2003 Gudesen et al. .......... 250/214.1

FOREIGN PATENT DOCUMENTS
JP A 2002-352963 12/2002

* cited by examiner

*Primary Examiner*—H. Jey Tsai
(74) *Attorney, Agent, or Firm*—Oliff & Berridge, PLC

(57) ABSTRACT

A light-emitting device includes an element array portion and an auxiliary interconnect. The element array portion includes a plurality of element groups. Each element group includes a plurality of light-emitting elements arranged in a first direction. Each light-emitting element has a structure such that a light-emitting layer lies between a first electrode and a second electrode. The element groups are arranged in a second direction perpendicular to the first direction. The auxiliary interconnect is formed of a material having a resistivity lower than the resistivity of the second electrode and is electrically connected to the second electrode of each light-emitting element. The plurality of element groups include a first element group and a second element group adjacent to each other and a third element group adjacent to the opposite side of the second element group from the first element group. The auxiliary interconnect extends in the first direction in a gap between the first element group and the second element group but is not formed in a gap between the second element group and the third element group.

12 Claims, 7 Drawing Sheets

LIGHT-EMITTING DEVICE, METHOD FOR MAKING THE SAME, AND ELECTRONIC APPARATUS

The entire disclosure of Japanese Application No. 2006-088306, filed Mar. 28, 2006 is expressly incorporated by reference herein.

BACKGROUND

1. Technical Field

The present invention relates to the structure of a light-emitting device that employs a light-emitting element such as an organic light-emitting diode element.

2. Related Art

A light-emitting device in which a large number of light-emitting elements are arranged in a matrix has been proposed. Each light-emitting element includes a first electrode, a second electrode, and a light-emitting layer lying between both electrodes. JP-A-2002-352963 discloses a top emission light-emitting device that includes a light-transmissive conductive layer shared by a plurality of light-emitting elements as their common second electrode. The device further includes auxiliary interconnects formed in the gaps between the light-emitting elements. The auxiliary interconnects are formed of a material having a resistivity lower than that of the second electrode. Due to this configuration, if the second electrode is formed of a high resistance material, the voltage drop in the second electrode is reduced. Therefore, the voltage applied to each light-emitting element is uniformized, and nonuniformity in gradation is controlled.

Most low resistance metals used as the material of the auxiliary interconnects block light. Therefore, when the auxiliary interconnects are disposed on the light emission side (light extraction side) of the light-emitting elements, the aperture ratio is restricted by the auxiliary interconnects. The "aperture ratio" is the ratio of the area of regions from which light is actually emitted, to the area of tale region where a plurality of light-emitting elements are arranged. If the width of the auxiliary interconnects is reduced, a high aperture ratio can be maintained. In this case, however, due to the increase in resistance value of the auxiliary interconnects, the voltage drop of the second electrode cannot be sufficiently controlled.

In some cases, in order to prevent the auxiliary interconnects from overlapping with the light-emitting elements even if there is an error in the positions of the auxiliary interconnects, a space (hereinafter referred to as "margin region") is provided between the region where each auxiliary interconnect is to be formed as designed and each light-emitting element. Since neither auxiliary interconnect nor light-emitting element is formed in the margin region, it is more difficult both to increase the aperture ratio and to sufficiently control the voltage drop.

SUMMARY

An advantage of some aspects of the invention is both to increase the aperture ratio and to control the voltage drop in the second electrode.

In an aspect of the invention, a light-emitting device includes an element array portion and an auxiliary interconnect. The element array portion includes a plurality of element groups (for example, element rows). Each element group includes a plurality of light-emitting elements arranged in a first direction (for example, in the X direction in FIG. 2). Each light-emitting element has a structure such that a light-emitting layer lies between a first electrode and a second electrode. The element groups are arranged in a second direction perpendicular to the first direction. The auxiliary interconnect is formed of a material having a resistivity lower than the resistivity of the second electrode and is electrically connected to the second electrode of each light-emitting element. The plurality of element groups include a first element group (for example, i-th row in FIG. 2) and a second element group (for example, (i+1)th row in FIG. 2) adjacent to each other and a third element group (for example, (i+2)th row in FIG. 2) adjacent to the opposite side of the second element group from the first element group. The auxiliary interconnect extends in the first direction in a gap between the first element group and the second element group but is not formed in a gap between the second element group and the third element group.

Since the auxiliary interconnect is not formed in the gap between the second element group and the third element group, the area of the region where the auxiliary interconnect is formed and the area of the margin region are small compared to the case where every gap between the element groups is provided with the auxiliary interconnect. Therefore, it is easy to achieve both high aperture ratio and low resistance auxiliary interconnect. For example, it is possible to increase the aperture ratio without reducing the width of the auxiliary interconnect or to increase the width (to reduce the resistance) of the auxiliary interconnect without reducing the aperture ratio.

It is preferable that the distance between any light-emitting element in the first element group and a corresponding light-emitting element in the second element group (for example, the gap S1 having a width B1 in FIG. 2) be larger than the distance between any light-emitting element in the second element group and a corresponding light-emitting element in the third element group (for example, the gap S2 having a width B2 in FIG. 2). In this case, compared to the case where the element groups are equally spaced, it is possible to achieve both low resistance auxiliary interconnect and high aperture ratio.

It is preferable that the second electrode be shared by a plurality of light-emitting elements, and the auxiliary interconnect be formed just below or just above the second electrode (that is to say, no insulating layer lie between the second electrode and the auxiliary interconnect) and be in face-contact with the second electrode. In this case, compared to the case where the second electrode is electrically connected to the auxiliary interconnect via a contact hole in an insulating layer therebetween, good electrical continuity can be established between the second electrode and the auxiliary interconnect. In addition, since the contact hole for electrically connecting the second electrode and the auxiliary interconnect is not necessary, the production process of the light-emitting device is simplified and the production cost thereof is reduced.

It is preferable that the light-emitting device further include a partition layer. The partition layer is preferably formed on the surface of a substrate on which the first electrodes of the light-emitting elements are disposed. The partition layer preferably has openings corresponding to the first electrodes. The light-emitting layer preferably includes portions that lie within the openings. The second electrode preferably includes portions that lie within the openings and that face the first electrodes across the light-emitting layer, and a portion that covers the surface of the partition layer. The auxiliary interconnect preferably lies between the partition layer and the second electrode. In this case, since the auxiliary interconnect is covered by the second electrode, corrosion of the auxiliary interconnect due to outside air or moisture can be prevented.

It is preferable that each light-emitting element be elongated along the first direction. In other words, the auxiliary interconnect preferably extends along the longitudinal direction of each light-emitting element. In this case, compared to the case where the auxiliary interconnect extends along the width direction of each light-emitting element, the width of the route of current from each light-emitting element to the auxiliary interconnect (for example, the width W in FIG. 5) is large, and therefore the resistance value in the section from each light-emitting element to the auxiliary interconnect is low. This case will hereinafter be described as a second exemplary embodiment.

It is preferable that the light-emitting device further include a plurality of drive transistors that control current supplied to each light-emitting element, and an insulating layer (for example, the second insulating layer F2 in FIG. 3) that covers the plurality of drive transistors. The plurality of light-emitting elements are preferably disposed on the surface of the insulating layer. The first electrodes of the light-emitting elements are preferably electrically connected to the drive transistors via contact holes formed in the insulating layer.

In this case, it is preferable that the contact holes corresponding to the light-emitting elements belonging to the first element group be formed on the auxiliary interconnect side of each light-emitting element in the first element group, and the contact holes corresponding to the light-emitting elements belonging to the second element group be formed on the auxiliary interconnect side of each light-emitting element in the second element group. It is more preferable that the contact holes corresponding to the light-emitting elements belonging to the first element group be formed in a gap (for example, the margin region M in FIG. 2) between the edge of each light-emitting element belonging to the first element group on the auxiliary interconnect side and the edge of the auxiliary interconnect on the first element group side, and the contact holes corresponding to the light-emitting elements belonging to the second element group are formed in a gap (for example, the margin region M in FIG. 2) between the edge of each light-emitting element belonging to the second element group on the auxiliary interconnect side and the edge of the auxiliary interconnect on the second element group side. In this case, since the contact holes are formed in the region beside the auxiliary interconnect where no light-emitting elements lie, the contact holes can be enlarged, without reducing the aperture ratio, so that good electrical continuity can be established between each first electrode and the corresponding drive transistor.

It is preferable that each contact hole be elongated along the first direction. In this case, since each contact hole has a sufficient area, the resistance of the junction between each first electrode and the corresponding drive transistor is low, and good electrical continuity can be established between them.

In another aspect of the invention, a light-emitting device includes an element array portion and a plurality of auxiliary interconnects. The element array portion includes a plurality of element groups. Each element group includes a plurality of light-emitting elements arranged in a first direction. Each light-emitting element has a structure such that a light-emitting layer lies between a first electrode and a second electrode. The element groups are arranged in a second direction perpendicular to the first direction. The plurality of auxiliary interconnects are formed of a material having a resistivity lower than the resistivity of the second electrode and are electrically connected to the second electrode of each light-emitting element. The element array portion is divided into units (for example, pairs of an even row and an adjacent odd row on the positive side in the Y direction in FIG. 2) each including two or more adjacent element groups. The auxiliary interconnects extend in the first direction in gaps between the units but are not formed in the gap or gaps between the element groups belonging to each unit. That is to say, since one auxiliary interconnect is formed every unit including a plurality of element groups, it is easy to achieve both high aperture ratio and low resistance auxiliary interconnects.

The light-emitting device according to the aspects of the invention is employed in various electronic apparatuses, typically as a display device. Examples of this type of electronic apparatus are personal computers and cellular phones. However, the application of the light-emitting device according to the aspects of the invention is not limited to displaying of images. The light-emitting device can be applied to various apparatuses, for example, exposure apparatuses (exposure heads) for forming a latent image on an image carrier such as a photoconductor drum by light irradiation, apparatuses that are disposed behind a liquid crystal apparatus and that illuminate the liquid crystal apparatus (back lights), and apparatuses that are mounted in an image scanner and that illuminate a document.

In another aspect of the invention, a method is used for making a light-emitting device including an element array portion and an auxiliary interconnect. The element array portion includes a plurality of element groups. Each element group includes a plurality of light-emitting elements arranged in a first direction. Each light-emitting element has a structure such that a light-emitting layer lies between a first electrode and a second electrode. The element groups are arranged in a second direction perpendicular to the first direction. The plurality of element groups include a first element group and a second element group adjacent to each other and a third element group adjacent to the opposite side of the second element group from the first element group. The auxiliary interconnect is electrically connected to the second electrode of each light-emitting element. The method includes preparing a mask and forming the auxiliary interconnect by vapor deposition of a material having a resistivity lower than the resistivity of the second electrode via the mask. The mask has an opening in a region (for example, the region RA in FIG. 4) corresponding to a gap between the first element group and the second element group but has no opening in a region (for example, the region RB3 in FIG. 4) corresponding to a gap between the second element group and the third element group.

The mask used in the above method has no opening in a region corresponding to a gap between the second element group and the third element group. Therefore, the mask has high mechanical strength compared to a mask that has openings corresponding to all gaps between the element groups. Therefore, errors in the auxiliary interconnect due no deformation (bending) of the mask and breakage of the mask can be controlled.

BRIEF DESCRIPTION OF THE DRAWINGS

The invention will be described with reference to the accompanying drawings, wherein like numbers reference like elements.

DESCRIPTION OF EXEMPLARY EMBODIMENTS

A: First Exemplary Embodiment

Configuration of Light-Emitting Device

Figure 1:
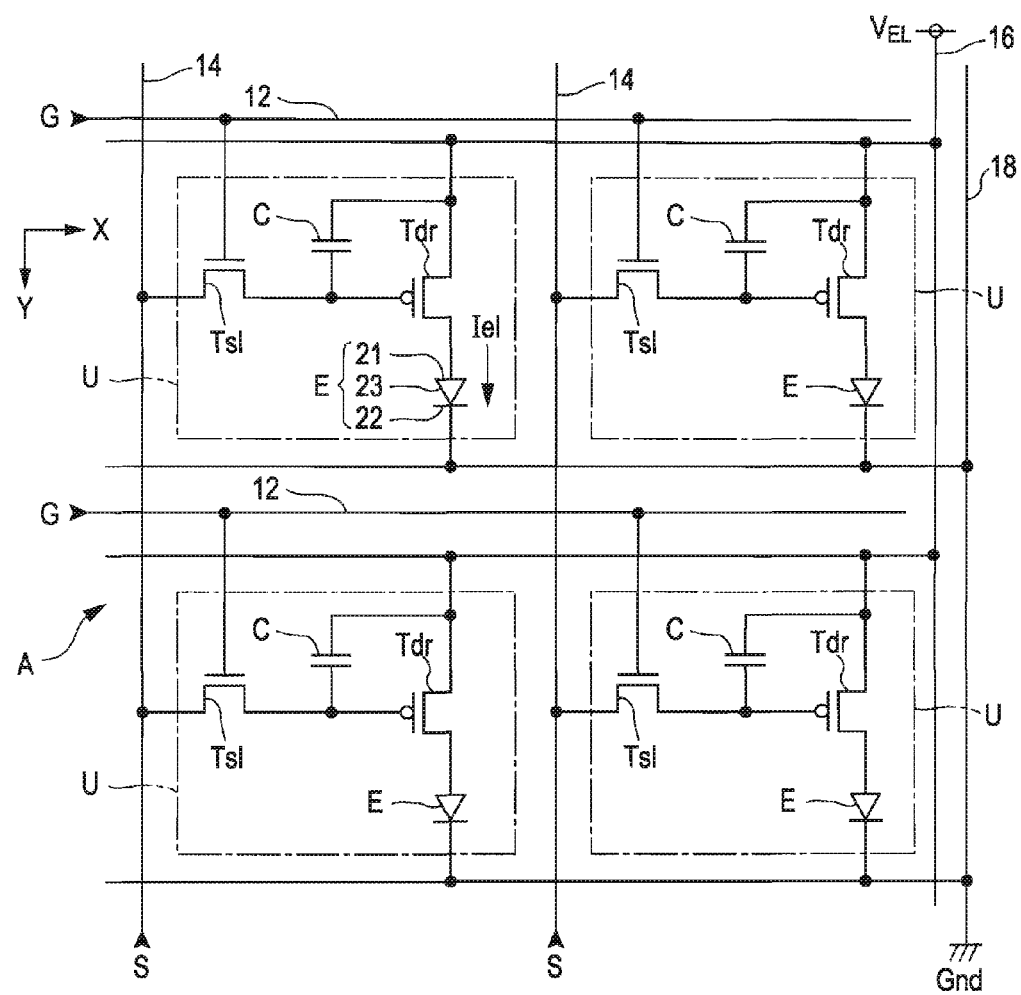
FIG. 1 is a circuit diagram showing the electrical configuration of a light-emitting device according to a first exemplary embodiment of the invention.

FIG. 1 is a circuit diagram showing the electrical configuration of a light-emitting device according to an exemplary embodiment of the invention. The light-emitting device has an element array portion A in which a plurality of unit circuits (pixel circuits) U are arranged. In the element array portion A are formed a plurality of scanning lines 12 extending in the X direction and a plurality of data lines 14 extending in the Y direction perpendicular to the X direction. The unit circuits U are disposed at positions corresponding to the intersections of the scanning lines 12 and the data lines 14. Therefore, the plurality of unit circuits U are arranged in the X direction and the Y direction in a matrix.

One unit circuit U Includes a drive transistor Tdr and a light-emitting element E disposed on a route from a source line 16 (source voltage VEL) to a ground line 18 (ground voltage Gnd). The light-emitting element E is an organic light-emitting diode element having a structure such that a light-emitting layer 23 is disposed between a first electrode 21 and a second electrode 22 facing each other. The light-emitting layer 23 is formed of an organic electro-luminescence (EL) material. The light-emitting element E emits light with luminance according to current Iel (hereinafter referred to as "drive current") flowing through the light-emitting layer 23. Each light-emitting element E has its respective first electrode (anode) 21. The first electrodes 21 are spaced. The second electrode (cathode) 22 is a common electrode shared by the plurality of light-emitting elements E and is electrically connected to the ground line 18. However, the second electrode 22 may be supplied with a negative voltage relative to ground potential Gnd.

The drive transistor Tdr is a p-channel transistor that controls the amount of drive current Iel according to the gate voltage. The drain of each drive transistor Tdr is connected to the first electrode 21 of the corresponding light-emitting element E. The source of the drive transistor Tdr in each unit circuit U is connected to the source line 16. Between the gate and the source (source line 16) of each drive transistor Tdr is interposed a capacitor element C. In addition, between the gate of each drive transistor Tdr and the corresponding data line 14 lies a selection transistor Tsl that controls the electrical connection therebetween.

In the above configuration, the selection transistor Tsl is turned ON according to a scanning signal G supplied to the scanning line 12. Via the selection transistor Tsl, the data line 14 supplies the gate of the drive transistor Tdr with a data voltage S according to the gradation specified for the light-emitting element E. At this time, a charge according to the data voltage S is stored in the capacitor element C. Therefore, even after the selection transistor Tsl is turned OFF, the gate of the drive transistor Tdr is maintained at the data voltage S. Therefore, the light-emitting element E is continuously supplied with drive current Iel according to the data voltage S.

Figure 2:
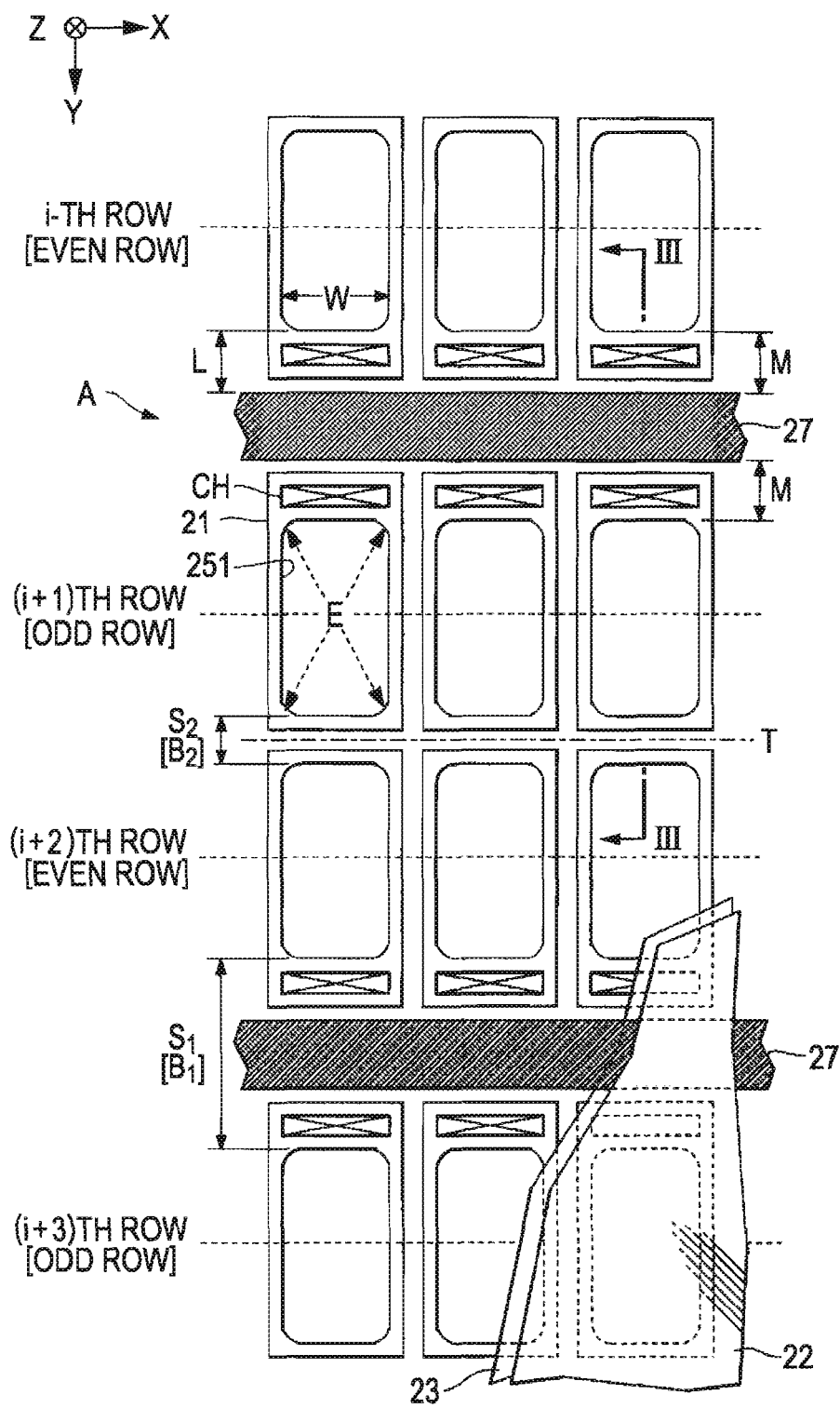
FIG. 2 is a plan view showing the configuration of the element array portion A.
Figure 3:
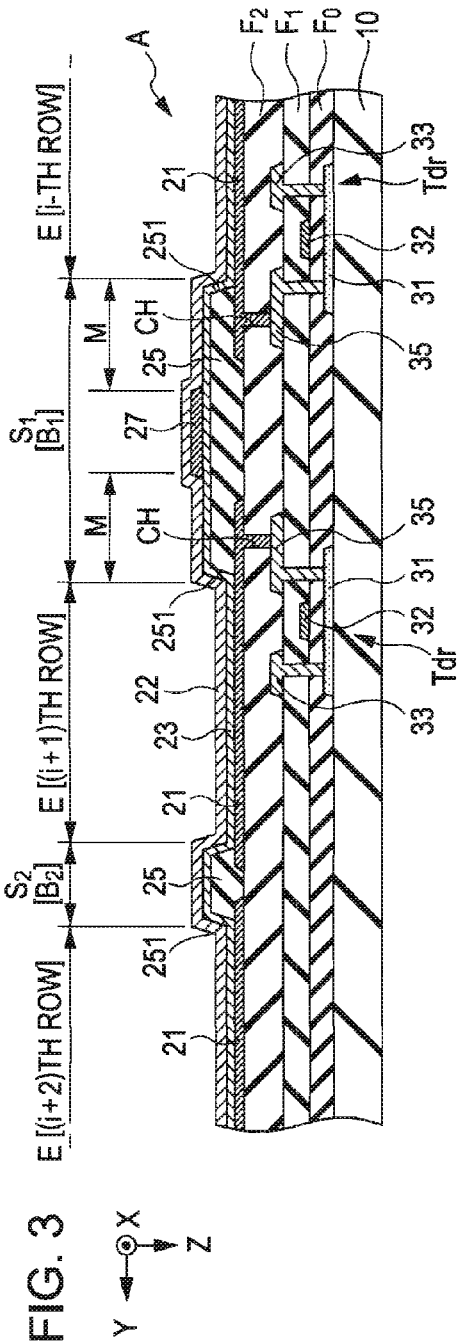
FIG. 3 is a sectional view taken along line III-III of FIG. 2.

Next, with reference to FIGS. 2 and 3, the specific configuration of the element array portion A will be described. FIG. 2 is a plan view showing the configuration of the element array portion A. FIG. 3 is a sectional view taken along line III-III of FIG. 2. In FIGS. 2 and 3, components such as the scanning lines 12, the data lines 14, and the selection transistors Tsl are not shown. In each figure to be hereinafter referred to, each component is show in a different scale, for convenience of illustration.

As shown in FIG. 3, components described with reference to FIG. 1, such as the drive transistors Tdr and the light-emitting elements E, are formed on the surface of a substrate 10. The substrate 10 is a plate formed of an insulating material, such as glass or plastic. The light-emitting device of the exemplary embodiment is a top emission type in which light radiated from the light-emitting elements E is emitted from the opposite side from the substrate 10. Therefore the substrate 10 is not required to be light-transmissive.

On the surface of the substrate 10 are disposed the drive transistors Tdr. Each drive transistor Tdr includes a semiconductor layer 31 and a gate electrode 32. The semiconductor layer 31 is formed of a semiconductor material on the surface of the substrate 10. The gate electrode 32 faces the semiconductor layer 31 (channel region) across a gate insulating layer F0. The gate electrode 32 is covered by a first insulating layer F1. The source electrode 33 and the drain electrode 35 of the drive transistor Tdr are formed on the surface of the first insulating layer F1 and are electrically connected to the semiconductor layer 31 (the source region and the drain region) via contact holes in the first insulating layer F1. The surface of the substrate 10 on which the drive transistors Tdr are formed, is covered by a second insulating layer F2. The first insulating layer F1 and the second insulating layer F2 are films formed of an insulating material such as silicon dioxide ($SiO_2$).

As shown in FIGS. 2 and 3, on the surface of the second insulating layer F2 are spaced the first electrodes 21 corresponding to the light-emitting elements E. The first electrodes 21 are rectangular electrodes elongated in the Y direction and are formed of a light-reflective conductive material having a work function higher than that of the second electrode 22. As shown in FIGS. 2 and 3, each first electrode 21 is electrically connected to the drain electrode 35 of the corresponding drive transistor Tdr via a contact hole CH in the second insulating layer F2.

The surface of the second insulating layer F2 on which the first electrodes 21 are formed, is covered by a partition layer 25. As shown in FIGS. 2 and 3, the partition layer 25 is an insulating film that has openings 251 (through holes in the thickness direction of the partition layer 25) formed in the regions corresponding to the first electrodes 21. As shown in FIG. 2, when viewed from the z direction, the inner edge of each opening 251 lies within the outer edge of the corresponding first electrode 21. That is to say, the first electrodes 21 are exposed by the openings 251 of the partition layer 25. Although, as described above, the periphery of each first electrode 21 is really covered by the partition layer 25, the outline of each first electrode 21 is shown by a solid line for convenience of illustration.

The light-emitting layer 23 is formed so as to cover the entire second insulating layer F2 on which the partition layer 25 is formed, and is shared by the plurality of light-emitting elements E. That is to say, the light-emitting layer 23 includes portions that lie within the openings 251 and that are in contact with the first electrodes 21 (in other words, portions that actually emit light) and a portion that lies on the surface of the partition layer 25. Since the first electrodes 21 are spaced, although the light-emitting layer 23 is shared by the plurality of light-emitting elements E, the luminance of the light-emitting layer 23 in each light-emitting element E is controlled individually according to the voltage of each first electrode 21. To promote the luminescence by the light-emitting layer 23 or improve the efficiency thereof, various function layers (a hole injection layer, a hole transport layer, an electron injection layer, an electron transport layer, a hole blocking layer, and an electron blocking layer) may be added to the light-emitting layer 23.

As shown in FIG. 3, the second electrode 22 is shared by the plurality of light-emitting elements E and covers the light-emitting layer 23 and the partition layer 25. That is to say, the second electrode 22 includes portions that face the first electrodes 21 across the light-emitting layer 23 within the openings 251 and a portion that lies on the surface of the partition layer 25. As shown in FIGS. 2 and 3, the light-emitting elements E are portions of the lamination of the first electrodes 21, the second electrode 22, and the light-emitting layer 23 that lie within the openings 251 as viewed from the Z direction (that is to say, regions where the drive current Iel flows from the first electrodes 21 to the second electrode 22). The region of the light-emitting layer 23 overlapping with the partition layer 25 does not emit light because current is blocked by the partition layer 25 lying between the first electrode 21 and the second electrodes 22. That is to say, the partition layer 25 defines each light-emitting element E.

The second electrode 22 is formed of a light-transmissive insulating material such as indium tin oxide (ITO) or indium zinc oxide (IZO). Therefore, light emitted from the light-emitting layer 23 away from the substrate 10, and light emitted toward the substrate 10 and reflected on the surface of the first electrodes 21, are emitted through the second electrode 22. That is to say, the light-emitting device of the exemplary embodiment is a top emission type.

Many of light-transmissive conductive materials have high resistivity. Therefore, the second electrode 22 formed of this kind of materials has high resistance, and a considerable voltage drop occurs in the plane thereof. Therefore, the voltage applied to each light-emitting element E differs depending on the position in the plane (X-Y plane) of the second electrode 22. Consequently, nonuniformity in the luminance of each light-emitting element E can occur. In order to control such nonuniformity in the amount of light, in the exemplary embodiment, auxiliary interconnects 27 are formed. The auxiliary interconnects 27 assist the electrical conductivity of the second electrode 22. The auxiliary interconnects 27 are formed of a conductive material having a resistivity lower than that of the second electrode 22 (for example, aluminum) and are electrically connected to the second electrode 22. The auxiliary interconnects 27 of the exemplary embodiment are formed between the second electrode 22 and the partition layer 25 (just below the second electrode 22).

Next, with reference to FIGS. 2 and 3, the layout of components will be described in detail. FIG. 2 shows three columns of light-emitting elements E belonging to the i-th to (i+3)th rows. The i-th row and the (i+2)th row are even rows, and the (i+1)th row and the (i+3)th row are odd rows.

As shown in FIG. 2, the gaps S1 (having a width of B1) between an even row and an adjacent odd row on the positive side in the Y direction are larger than the gaps S2 (having a width of B2) between an odd row and an adjacent even row on the positive side in the Y direction (B1>B2). The auxiliary interconnects 27 are formed in the gaps S1 so as to extend in the X direction but are not formed in the gaps S2. For example, the gap S1 between the i-th row and the (i+1)th row and the gap S1 between the (i+2)th row and the (i+3)th row are provided with the auxiliary interconnects 27. The gap S2 between the (i+1)th row and the (i+2)th row is not provided with the auxiliary interconnect 27. That is to say, when the element array portion A is divided into units each including two rows, an odd row and an adjacent even row on the positive side in the Y direction, the gaps between the units adjacent in the Y direction are provided with the auxiliary interconnects 27, but the gap between two rows in each unit is not provided with the auxiliary interconnect 27. As described above, in the exemplary embodiment, one auxiliary interconnect 27 is provided for every two rows.

An error in the positions where the auxiliary interconnects 27 are formed can occur for manufacturing technique reasons. For example, when the auxiliary interconnects 27 are formed by vapor deposition using a mask (hereinafter described in detail), due to a dimension error of the mask and/or a positioning error between the substrate 10 and the mask, the auxiliary interconnects 27 can be formed at positions different from the desired positions (designed positions). In the exemplary embodiment, margin regions M are provided between the designed position of each auxiliary interconnect 27 and the rows of light-emitting elements E adjacent thereto in the width direction (Y direction) so that the auxiliary interconnects 27 do not overlap with the light-emitting elements E as viewed from the Z direction even if there is an error in the positions of the auxiliary interconnects 27. As shown in FIGS. 2 and 3, each margin region X is between the edge of the corresponding auxiliary interconnect 27 and the edges of the corresponding light-emitting elements E (the inner edges of the corresponding openings 251) on the auxiliary interconnect 27 side.

Since one auxiliary interconnect 27 is provided for every two rows, the margin regions M are provided only in the gaps S1 (between an even row and an adjacent odd row on the positive side in the Y direction) and are not provided in the gaps S2 (between an odd row and an adjacent even row on the positive side in the Y direction). As shown in FIGS. 2 and 3, the contact hole CH that connects the first electrode 21 of each light-emitting element E and the corresponding drive transistor Tdr is formed in the margin region M between the light-emitting element E and the adjacent auxiliary interconnect 27 and is elongated along the X direction, in which the auxiliary interconnect 27 extends. Therefore, the arrangement of each light-emitting element E and the corresponding contact hole CH in the Y direction in the odd rows is the reverse of that in the even rows. That is to say, in the even rows, each contact hole CH lies on the positive side in the Y direction of the corresponding light-emitting element E. In contrast, in the odd rows, each contact hole CH lies on the negative side in the Y direction of the corresponding light-emitting element E. In other words, the layout of the light-emitting elements E in an odd row and that in the adjacent even row are symmetrical with respect to an axis line T extending in the X direction, between both rows.

As described above, since one auxiliary interconnect 27 is provided for every two rows in the exemplary embodiment, compared to the configuration in which every gap between the rows is provided with the auxiliary interconnect 27 (hereinafter referred to as "known configuration"), the total area required for forming the auxiliary interconnects 27 and for providing the margin regions M in the region where the light-emitting elements E are arrayed (element array portion A), can be reduced (by half). Therefore, the resistance of the auxiliary interconnects 27 can easily be reduced without reducing the aperture ratio. For example, when the aperture ratio of the element array portion A is equal to that of the known configuration, since the number of the auxiliary interconnects 27 and the area of the corresponding margin regions M are smaller, the width of the auxiliary interconnects 27 can be made larger than that of the known configuration. When the width of the auxiliary interconnects 27 is equal to that of the known configuration, since the area that the auxiliary interconnects 27 and the margin regions M occupy in the element array portion A is smaller, the area of each light-emitting element E can be increased so that the aperture ratio can be made higher than that of the know configuration. When the amount of the drive current Iel is equal to that of the known configuration, due to the increase in the aperture ratio, the mount of light of each light-emitting element E can be increased. In addition, the electrical energy (drive current Iel) to be supplied to each light-emitting element E so that the light emitting device can emit a desired amount of light, is reduced due to the increase in the aperture ratio. Therefore, deterioration due to the supply of electrical energy is controlled, and the light-emitting elements E have a longer life.

The gaps S2 (having a width of B2) between an odd row and an adjacent even row on the positive side in the Y direction are regions that do not contribute to luminescence (so-called dead spaces). Therefore, if all rows of light-emitting elements E are arranged at equal spaces B1 along the Y direction, the aperture ratio in the element array portion A is restricted. In the exemplary embodiment, the gaps S2 are smaller than the gaps S1 (B2<B1). Therefore, compared to the configuration in which the light-emitting elements E are arranged at equal spaces B1 along the Y direction, the aperture ratio can be easily increased.

In the part of the surface of each first electrode 21 overlapping with the corresponding contact hole CH appears a depression having the shape of the contact hole CH. Therefore, if each light-emitting element E is formed so as to overlap with the corresponding contact hole CH, (that is to say, if each contact hole CH lies within the corresponding opening 251) the thickness of the light-emitting layer 23 differs between the region facing the contact hole CH and the other region, and thereby the uniformity in the luminance of each light-emitting element E can be deteriorated. In addition, light emitted from each light-emitting element E is scattered by the depression on the surface of the first electrode 21. This also causes the nonuniformity in the luminance. In the exemplary embodiment, each light-emitting element E is formed so as not to overlap with the corresponding contact hole CH as viewed from the Z direction. That is to say, the light-emitting layer 23 of each light-emitting element E is formed on the flat surface with no depression of the first electrode 21. Therefore, the luminance of each light-emitting element E can be uniformized.

In the configuration in which the contact holes CH are formed outside the margin regions M, the larger the area of the contact holes CH, the smaller the area of the light-emitting elements E and therefore the lower the aperture ratio. In, the exemplary embodiment, since the contact holes CH are formed within the margin regions M, which do not contribute to luminescence (that is to say, where no light-emitting elements E are formed), it is possible to sufficiently increase the area of the contact holes CH without reducing the area of the light-emitting elements E. For example, as shown in FIG. 2, elongating the contact holes CH in the X direction lowers the contact resistance between each first electrode 21 and the corresponding drive transistor Tdr and controls defective electrical continuity therebetween.

Method for Making Light-Emitting Device

Next, a method for making the light-emitting device according to the exemplary embodiment, more specifically a process of forming the auxiliary interconnects 27 will be described. The auxiliary interconnects 27 of the exemplary embodiment are formed by vapor deposition (vacuum deposition) using a mask. As for the formation of components other than the auxiliary interconnects 27, all known techniques are adopted.

Figure 4:
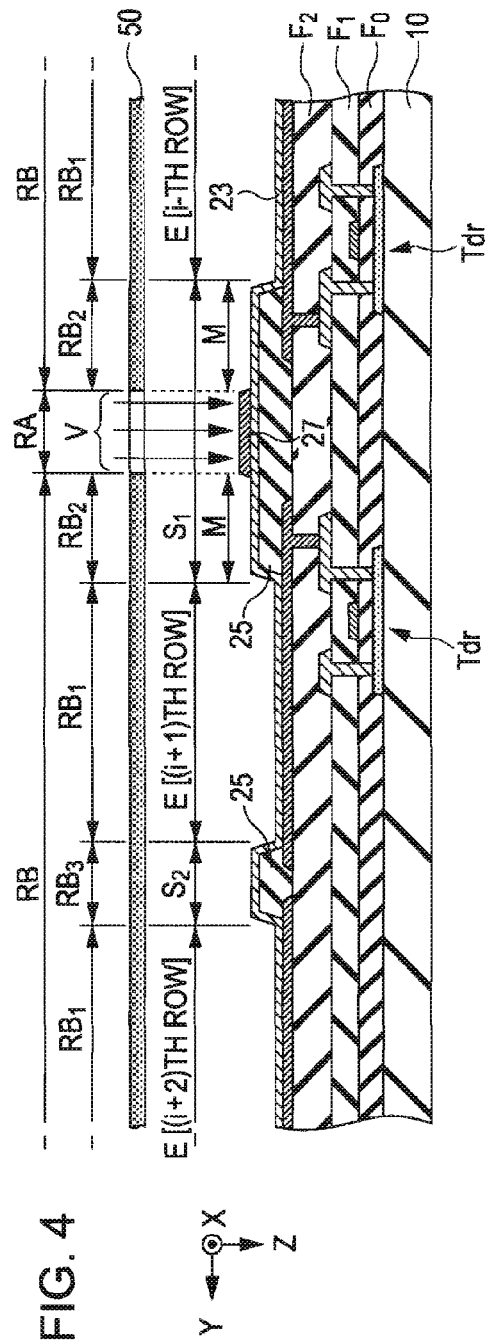
FIG. 4 is a sectional view illustrating the process of forming the auxiliary interconnects.

FIG. 4 is a sectional view illustrating the process of forming the auxiliary interconnects 27 (a sectional view corresponding to FIG. 3). As shown in FIG. 4, before the formation of the auxiliary interconnects 27, a mask 50 for vapor deposition is prepared. The mask 50 has openings in regions RA but has no openings in the other region RB. The regions RA are slit-like regions extending in the X direction so as to face the regions where the auxiliary interconnects 27 are formed. That is to say, the regions RA are regions facing the gaps S1 between an even row (i-th row or (i+2)th row) and an adjacent odd row on the positive side nil the Y direction ((i+1)th row or (i+3)th row), more specifically the gaps S1 excluding the margin regions M. On the other hand, the region RB includes regions RB1, regions RB2, and regions RB3. The regions RB1 are regions facing the light-emitting elements E. The regions RB2 are regions facing the margin regions M. The regions RB3 are regions facing the gaps S2 between an odd row ((i+1)th row) and an adjacent even row on the positive side in the Y direction ((i+2)th row) and having a width of B2.

By vapor deposition using the above-described mask 50, the auxiliary interconnects 27 are formed. That is to say, a light-emitting device whose light-emitting layer 23 is already formed (but whose second electrode 22 is not yet formed) is placed in vacuum, and the mask 50 is disposed so as to face the light-emitting layer 23. Next, vapor V of a conductive material having a resistivity lower than that of the second electrode 22 is sprayed over the light-emitting device from the mask 50 side. In the above process, vapor V blocked by the region RB of the mask 50 does not reach the light-emitting device, and vapor V passing through the regions RA of the mask 50 selectively adheres to and accumulates on the surface of the light-emitting layer 23, and thereby the auxiliary interconnects 27 are formed in the shape shown in FIG. 2.

In the light-emitting device of the exemplary embodiment, one auxiliary interconnect 27 is provided for every two rows of the light-emitting elements E. Therefore, as shown in FIG. 4, the mask 50 need not have openings in the regions RB3. That is to say, compared to the case where every gap between the rows is provided with the auxiliary interconnect 27 as in the known configuration (the case where the mask 50 has openings not only in the regions RA but also in the regions RB3), the mechanical strength of the mask 50 can be sufficiently maintained. Therefore, errors in the dimension and the position of each auxiliary interconnect 27 due to deformation of the mask 50 (for example, bending due to its own weight) can be controlled.

B: Second Exemplary Embodiment

Next, a second exemplary embodiment of the invention will be described. In the description of this exemplary embodiment, the same reference numerals will be used to designate the same components as those in the first exemplary embodiment, so that the detailed description will be omitted.

Figure 5:
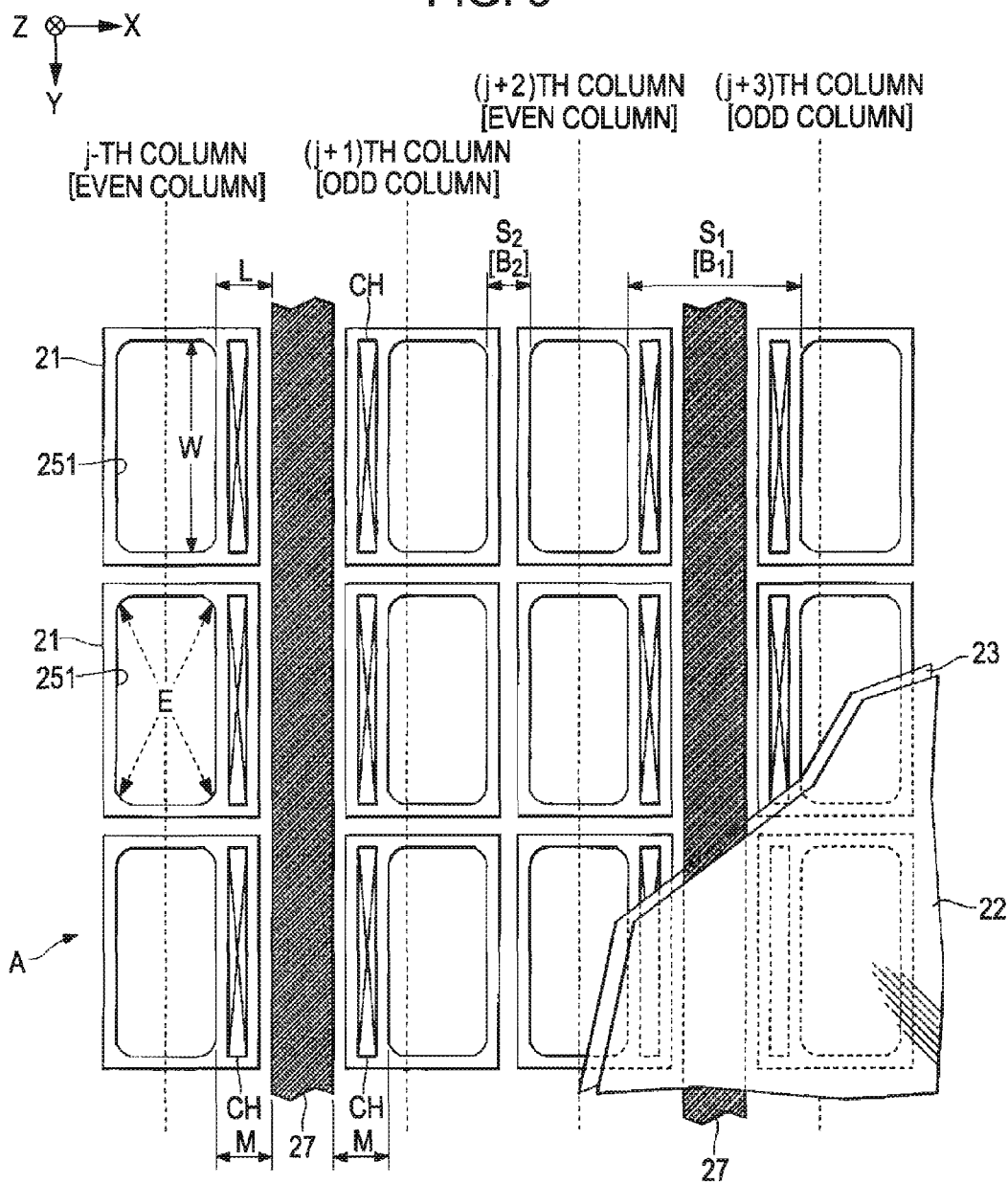
FIG. 5 is a plan view showing the configuration of the element array portion in a second exemplary embodiment.

FIG. 5 is a plan view showing the configuration of the element array portion A according to the exemplary embodiment (a plan view corresponding to FIG. 2). In the first exemplary embodiment, the auxiliary interconnects 27 extend along the short side of the light-emitting elements E (in the X direction). In contrast, in the exemplary embodiments the auxiliary interconnects 27 extend along the long side of the light-emitting elements E (in the Y direction) as shown in FIG. 5. FIG. 5 shows three rows of light-emitting elements E belonging to the j-th to (j+3)th columns. The j-th column and the (j+2)th column are even columns, and the (j+1)th column and the (j+3)th column are odd columns.

As shown in FIG. 5, in the exemplary embodiment, one auxiliary interconnect 27 is provided for every two columns. That is to say, the gap S1 between the j-th column and the (j+1)th column and the gap S1 between the (j+2)th column and the (j+3)th column (having a width of B1) are provided with the auxiliary interconnects 27 extending in the Y direction. On the other hand, the gap S2 between the (j+1)th column and the (j+2)th column (having a width of B2 (B2<B1)) is not provided with the auxiliary interconnect 27. Therefore, the exemplary embodiment has the same advantageous effects as the first exemplary embodiment does.

Next, the resistance value of the section in which the drive current Iel flows from each light-emitting element E into the corresponding auxiliary interconnect 27 (hereinafter referred to as "cathode side resistance") will be described. The cathode side resistance R is proportional to the distance L from the edge of the light-emitting element E to the auxiliary interconnect 27 and is inversely proportional to the dimension W of the light-emitting element E along the direction in which the auxiliary interconnect 27 extends (see FIGS. 2 and 5). In the second exemplary embodiment, since the auxiliary interconnects 27 extend along the long side of the light-emitting elements E, the dimension W is sufficiently long compared to the first exemplary embodiment in which the auxiliary interconnects 27 extend along the short side of the light-emitting elements E, Therefore, in the exemplary embodiment, the cathode side resistance R is low compared to the first exemplary embodiment. Since the voltage drop in the second electrode 22 is controlled, the source voltage VEL required for driving the light-emitting elements E is low compared to the case where the cathode side resistance R is high.

In addition, in the exemplary embodiment, since the auxiliary interconnects 27 extend along the long side of the light-emitting elements E, the margin region M corresponding to one light-emitting element E is large compared to the first exemplary embodiment. Therefore, the area of the contact hole CH in the margin region M can be increased. Therefore, good electrical continuity can be established between each first electrode 21 and the corresponding drive transistor Tdr without reducing the aperture ratio.

C: Third Exemplary Embodiment

Next, a third exemplary embodiment of the invention will be described. In the description of this exemplary embodiment, the same reference numerals will be used to designate the same components as those in the first exemplary embodiment, so that the detailed description will be omitted.

Figure 6:
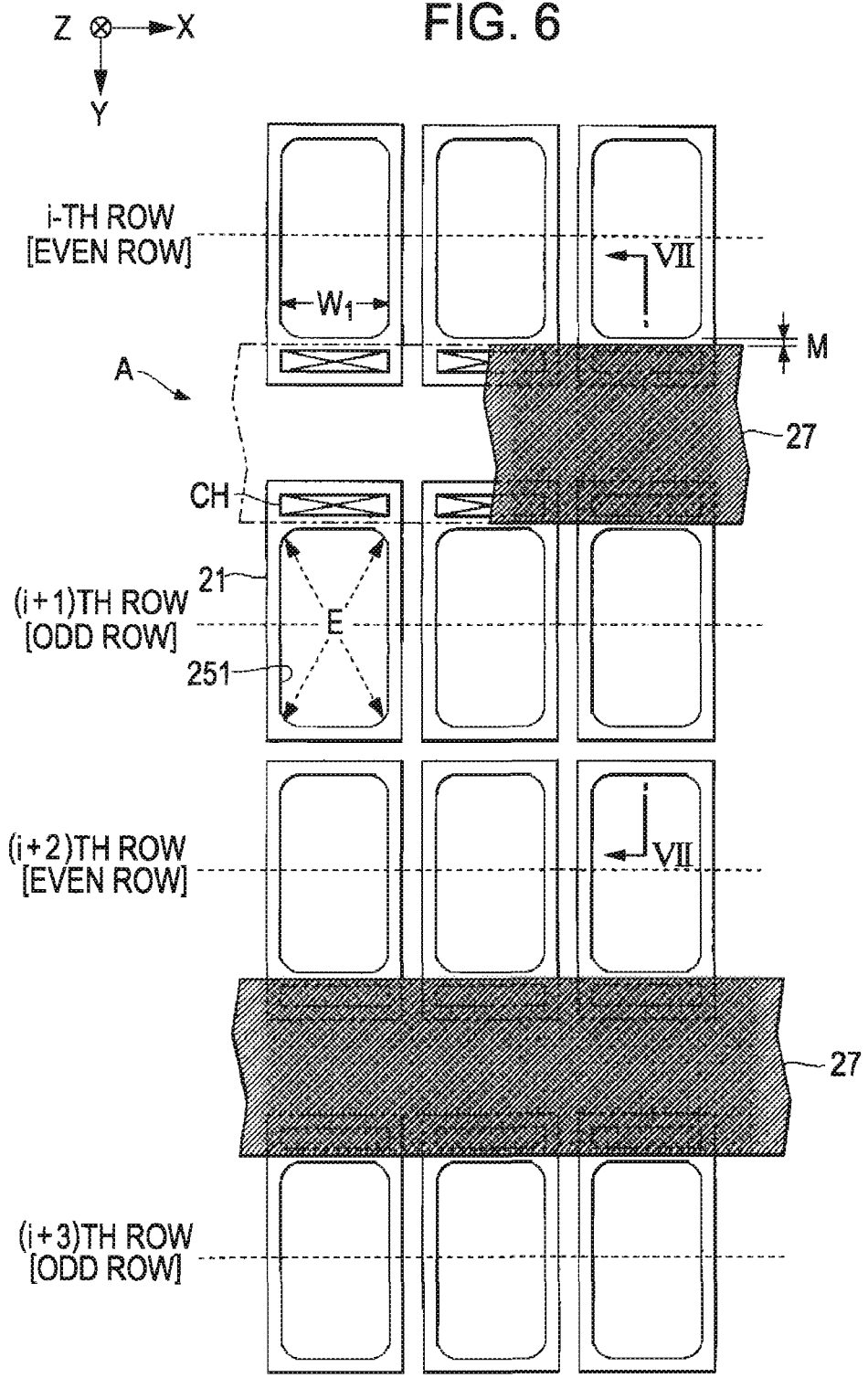
FIG. 6 is a plan view showing the configuration of the element array portion in a third exemplary embodiment.
Figure 7:
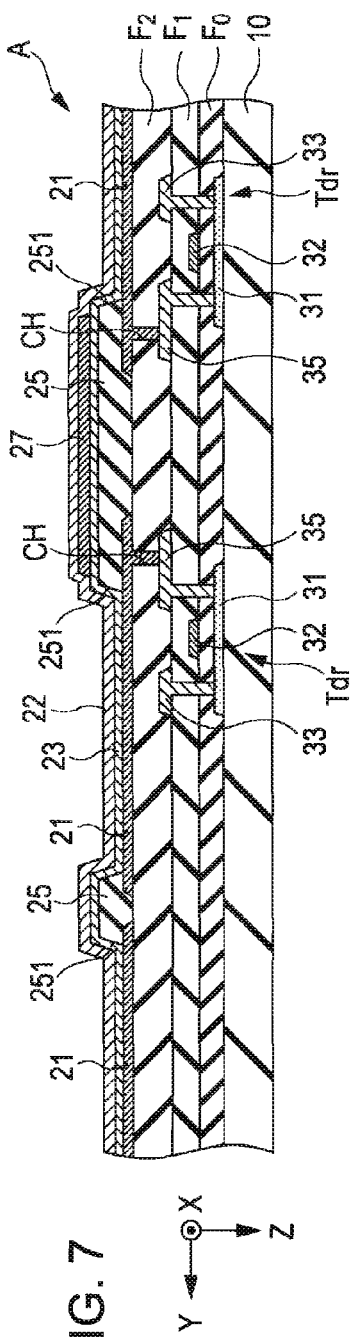
FIG. 7 is a sectional view taken along line VII-VII of FIG. 6.

FIG. 6 is a plan view showing the configuration of the element array portion A according to the exemplary embodiment (a plan view corresponding to FIG. 2). FIG. 7 is a sectional view taken along line VII-VII of FIG. 6. In the first exemplary embodiment, the auxiliary interconnects 27 do note overlap with the contact holes CH. In contrast, in the exemplary embodiment, as shown in FIGS. 6 and 7, the auxiliary interconnects 27 overlap with the contact holes CH as viewed from the Z direction. That is to say, the auxiliary interconnects 27 have a width substantially equal to the width of the partition layer 25, and overlap with the contact holes CH corresponding to the light-emitting elements E in an even row and the contact holes CH corresponding to the light-emitting elements E in an adjacent odd row on the positive side in the Y direction. As in the first exemplary embodiment, the auxiliary interconnects 27 are not formed in the gaps between an odd row and an adjacent even row on the positive side in the Y direction. The gap between each edge of each auxiliary interconnect 27 and the edge of each light-emitting element E adjacent thereto (part of the gap between each contact hole CH and the corresponding light-emitting element E) serves as a margin region M.

Since the resistance value of the auxiliary interconnects 27 according to the above configuration is reduced compared to the first exemplary embodiment, the voltage drop in the second electrode 22 is more dramatically controlled. Although FIGS. 6 and 7 show a modification of the light-emitting device of the first exemplary embodiment, the configuration in which the auxiliary interconnects 27 overlap with the contact holes CH can also be applied to the light-emitting device of the second exemplary embodiment.

As described above, each first electrode 21 has a depression on its surface just above the corresponding contact hole CH. Since the auxiliary interconnects 27 block light, if light emitted from the light-emitting elements E or outside light reaches the depressions, light scattered by the depressions is blocked by the auxiliary interconnects 27 and is not emitted outside. Therefore, uniform luminance is achieved throughout the element array portion A.

D: Variations

Various changes can be made in the above exemplary embodiments. Specific examples of such changes are as follows. The following variations may be combined.

(1) Variation 1

In the above exemplary embodiments, one auxiliary interconnect 27 is provided for every two rows or columns. However, the ratio of the number of rows or columns to the number of auxiliary interconnects 27 may be changed. For example, one auxiliary interconnect 27 may be provided for every three rows or columns of light-emitting elements E. The pitch between the auxiliary interconnects 27 (the number of rows or columns of light-emitting elements E between adjacent auxiliary interconnects 27) need not necessarily be equal throughout the element array portion A. The pitch may be changed according to the position in the element array portion A.

(2) Variation 2

In the above exemplary embodiments, a single light-emitting layer 23 is shared by a plurality of light-emitting elements E. However, each light-emitting element E may have its own sight-emitting layer 23 (formed within the corresponding opening of the partition layer 25). The partition layer 25 may be omitted.

(3) Variation 3

In the above exemplary embodiments, the unit circuit U may have any specific configuration. For example, although FIG. 1 shows a voltage programming circuit in which the luminance of the light-emitting element E is determined according to the voltage value of the data line 14, the unit circuit U may be a current programming circuit in which the luminance of the light-emitting element E is determined according to the current value of the data line 14. In the above exemplary embodiment, the light-emitting device is an active matrix type in which drive current Iel is controlled by drive transistors Tdr. However, the invention can be applied to a passive matrix light-emitting device in which each unit circuit U includes no active elements.

(4) Variation 4

In the above exemplary embodiments, the auxiliary interconnects 27 are disposed between the partition layer 25 and the second electrode 22. However, the position of the auxiliary interconnects 27 can be changed. For example, the auxiliary interconnects 27 may be disposed on the upper surface of the second electrode 22 (the opposite surface from the partition layer 25). When no other layers such as an insulating layer are interposed between each auxiliary interconnect 27 and the second electrode 22 (that is to say, when each auxiliary interconnect 27 is formed just above or just below the second electrode 22), one of the auxiliary interconnect 27 and the second electrode 22 is formed after the other is formed, and thereby they are electrically connected. Therefore, compared to the configuration in which, for example, an insulating layer is interposed between each auxiliary interconnect 27 and the second electrode 22 (the configuration in which each auxiliary interconnect 27 and the second electrode 22 are electrically connected via a contact hole in the insulating layer), the production process is simplified and the production cost is reduced.

The auxiliary interconnects 27 may be formed on the substrate 10 side of the light-emitting layer 23. For example, it is possible to form the auxiliary interconnects 27 by patterning of the same conductive film as the gate electrodes 32 of the drive transistors Tdr and to electrically connect the auxiliary interconnects 27 to the second electrode 22 via contact holes formed in the first insulating layer F1 and the second insulating layer F2.

(5) Variation 5

In the above exemplary embodiments, each light-emitting element E includes a light-emitting layer 23 formed of an organic EL material. However, the light-emitting element E in the invention is not limited to this. Various light-emitting elements E, for example, a light-emitting element E including a light-emitting layer 23 formed of an inorganic EL material, and a light-emitting diode (LED) element, can be adopted. In the invention, the specific structure and material of the light-emitting element E are not limited as long as the light-emitting element E emits light by the supply of electrical energy (typically, the supply of current).

E: Applications

Figure 8:
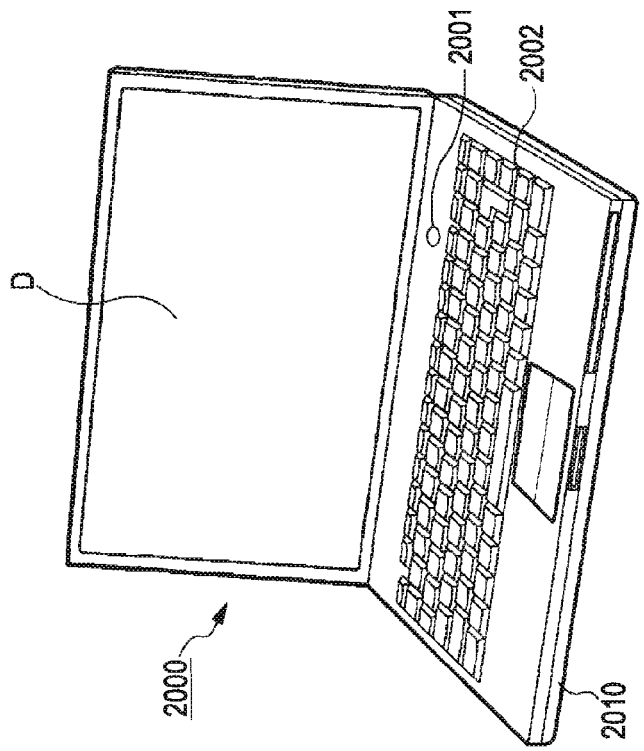
FIG. 8 is a perspective view showing a form of electronic apparatus (a personal computer) according to the invention.
Figure 9:
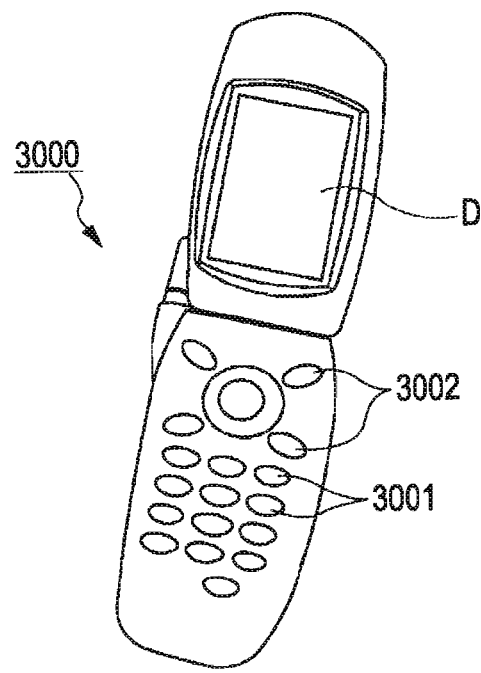
FIG. 9 is a perspective view showing a form of electronic apparatus (a cellular phone) according to the invention.
Figure 10:
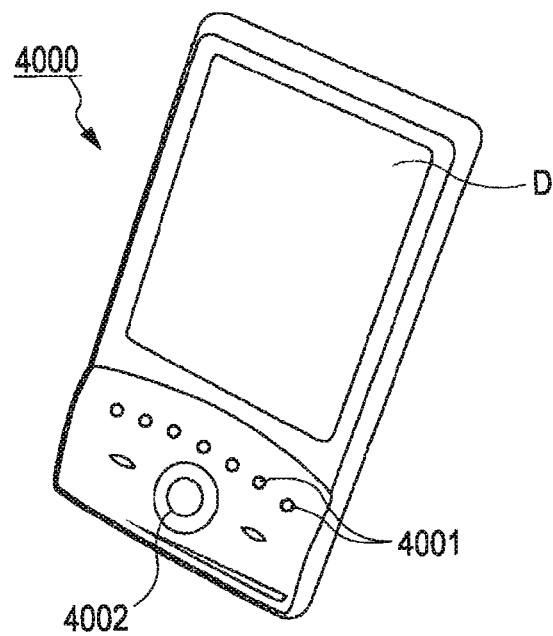
FIG. 10 is a perspective view showing a form of electronic apparatus (a personal digital assistant) according to the invention.

Next, electronic apparatuses employing the light-emitting device according to the invention will be described. FIGS. 8 to 10 show electronic apparatuses that employ the light-emitting device according to any one of the above exemplary embodiments as a display device.

FIG. 8 is a perspective view showing the configuration of a mobile personal computer that employs the light-emitting device. The personal computer 2000 includes a light-emitting device D that displays various images and a main body 2010 including a power switch 2001 and a keyboard 2002. The light-emitting device D employs organic light-emitting diode elements as light-emitting elements E and can therefore display an easily viewable screen with a wide viewing angle.

FIG. 9 is a perspective view showing the configuration of a cellular phone to which the light-emitting device is applied. The cellular phone 3000 includes a plurality of operation buttons 3001, a plurality of scroll buttons 3002, and a light-emitting device D that displays various images. A user operates the scroll buttons 3002 to scroll the image displayed on the light-emitting device D.

FIG. 10 is a perspective view showing the configuration of a personal digital assistant (PDA) to which the light-emitting device is applied. The personal digital assistant 4000 includes a plurality of operation buttons 4001, a power switch 4002, and a light-emitting device that displays various images. A user operates the power switch 4002 to display various pieces of information such as an address book and a schedule book.

The light-emitting device according to the invention is applied not only to the apparatuses shown in FIGS. 8 to 10 but also digital still cameras, televisions, camcorders, car navigation systems, pagers, electronic notebooks, electronic papers, calculators, word processors, workstations, videophones, POS terminals, printers, scanners, photocopiers, video players, apparatuses having a touch panel, and the like. The application of the light-emitting device according to the invention is not limited to displaying of images. Image forming apparatuses such as optical writing printers and electronic photocopiers employ an optical head (writing head) that expose a photoreceptor according to the image to be formed on paper. The light-emitting device of the invention can also be used as this kind of optical head.

What is claimed is:

1. A light-emitting device comprising:
    an element array portion including a plurality of element groups, each element group including a plurality of light-emitting elements arranged in a first direction, each light-emitting element having a structure such that a light-emitting layer lies between a first electrode and a second electrode, the element groups being arranged in a second direction perpendicular to the first direction; and
    an auxiliary interconnect that is formed of a material having a resistivity lower than the resistivity of the second electrode and that is electrically connected to the second electrode of each light-emitting element,
    wherein the plurality of element groups include a first element group and a second element group adjacent to each other and a third element group adjacent to the opposite side of the second element group from the first element group, and the auxiliary interconnect extends in the first direction in a gap between the first element group and the second element group but is not formed in a gap between the second element group and the third element group.

2. The light-emitting device according to claim 1, wherein the distance between any light-emitting element in the first element group and a corresponding light-emitting element in the second element group is larger than the distance between any light-emitting element in the second element group and a corresponding light-emitting element in the third element group.

3. The light-emitting device according to claim 1, wherein the second electrode is shared by a plurality of light-emitting elements, and the auxiliary interconnect is formed just below or just above the second electrode and is in face-contact with the second electrode.

4. The light-emitting device according to claim 3, further comprising a partition layer that is formed on the surface of a substrate on which the first electrodes of the light-emitting elements are disposed and that has openings corresponding to the first electrodes, wherein the light-emitting layer includes portions that lie within the openings, the second electrode includes portions that lie within the openings and that face the first electrodes across the light-emitting layer, and a portion that covers the surface of the partition layer, and the auxiliary interconnect lies between the partition layer and the second electrode.

5. The light-emitting device according to claim 3, wherein each light-emitting element is elongated along the first direction.

6. The light-emitting device according to claim 1, further comprising a plurality of drive transistors that control current supplied to each light-emitting element, and an insulating layer that covers the plurality of drive transistors, wherein the plurality of light-emitting elements are disposed on the surface of the insulating layer, and the first electrodes of the light-emitting elements are electrically connected to the drive transistors via contact holes formed in the insulating layer.

7. The light-emitting device according to claim 6, wherein the contact holes corresponding to the light-emitting elements belonging to the first element group are formed on the auxiliary interconnect side of each light-emitting element in the first element group, and the contact holes corresponding to the light-emitting elements belonging to the second element group are formed on the auxiliary interconnect side of each light-emitting element in the second element group.

8. The light-emitting device according to claim 7, wherein the contact holes corresponding to the light-emitting elements belonging to the first element group are formed in a gap between the edge of each light-emitting element belonging to the first element group on the auxiliary interconnect side and the edge of the auxiliary interconnect on the first element group side, and the contact holes corresponding to the light-emitting elements belonging to the second element group are formed in a gap between the edge of each light-emitting element belonging to the second element group on the auxiliary interconnect side and the edge of the auxiliary interconnect on the second element group side.

9. The light-emitting device according to claim 6, wherein each contact hole is elongated along the first direction.

10. A light-emitting device comprising:
an element array portion including a plurality of element groups, each element group including a plurality of light-emitting elements arranged in a first direction, each light-emitting element having a structure such that a light-emitting layer lies between a first electrode and a second electrode, the element groups being arranged in a second direction perpendicular to the first direction; and
a plurality of auxiliary interconnects that are formed of a material having a resistivity lower than the resistivity of the second electrode and that are electrically connected to the second electrode of each light-emitting element, wherein the element array portion is divided into units each including two or more adjacent element groups, and the auxiliary interconnects extend in the first direction in gaps between the units but are not formed in the gap or gaps between the element groups belonging to each unit.

11. An electronic apparatus comprising the light-emitting device according to claim 1.

12. A method for making a light-emitting device including:
an element array portion including a plurality of element groups, each element group including a plurality or light-emitting elements arranged in a first direction, each light-emitting element having a structure such that a light-emitting layer lies between a first electrode and a second electrode, the element groups being arranged in a second direction perpendicular to the first direction, the plurality of element groups including a first element group and a second element group adjacent to each other and a third element group adjacent to the opposite side of the second element group from the first element group; and
an auxiliary interconnect electrically connected to the second electrode of each light-emitting element,
the method comprising:
preparing a mask that has an opening in a region corresponding to a gap between the first element group and the second element group but has no opening in a region corresponding to a gap between the second element group and the third element group; and
forming the auxiliary interconnect by vapor deposition of a material having a resistivity lower than the resistivity of the second electrode via the mask.

* * * * *